(12) United States Patent
Jagota et al.

(10) Patent No.: US 7,479,318 B2
(45) Date of Patent: *Jan. 20, 2009

(54) FIBRILLAR MICROSTRUCTURE AND PROCESSES FOR THE PRODUCTION THEREOF

(75) Inventors: Anand Jagota, Wilmington, DE (US); Jinsoo Kim, Avondale, PA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 659 days.

This patent is subject to a terminal disclaimer.

(21) Appl. No.: 10/933,725

(22) Filed: Sep. 2, 2004

(65) Prior Publication Data

US 2005/0181629 A1    Aug. 18, 2005

Related U.S. Application Data

(60) Provisional application No. 60/501,524, filed on Sep. 8, 2003, provisional application No. 60/501,522, filed on Sep. 8, 2003.

(51) Int. Cl.
*B32B 3/26* (2006.01)
*B32B 3/02* (2006.01)
*B32B 33/00* (2006.01)

(52) U.S. Cl. .............................. 428/92; 428/88; 428/89; 428/97

(58) Field of Classification Search .................... 428/92, 428/97, 88, 89
See application file for complete search history.

(56) References Cited

U.S. PATENT DOCUMENTS

| | | | | |
|---|---|---|---|---|
| 3,950,582 A * | 4/1976 | Keuchel | ...................... | 428/85 |
| 4,233,349 A * | 11/1980 | Niederhauser | ............... | 428/92 |
| 6,737,160 B1 * | 5/2004 | Full et al. | .................... | 428/397 |
| 6,866,911 B1 * | 3/2005 | DeMott et al. | ................ | 428/92 |
| 6,872,438 B1 * | 3/2005 | Allgeuer et al. | ............... | 428/92 |
| 6,872,439 B2 * | 3/2005 | Fearing et al. | ................ | 428/99 |
| 7,011,723 B2 * | 3/2006 | Full et al. | ...................... | 156/60 |
| 7,056,409 B2 * | 6/2006 | Dubrow | ...................... | 156/276 |
| 7,074,294 B2 * | 7/2006 | Dubrow | ...................... | 156/276 |
| 7,132,161 B2 * | 11/2006 | Knowles et al. | ............. | 428/364 |
| 7,144,624 B2 * | 12/2006 | Knowles et al. | ............. | 428/364 |
| 7,229,685 B2 * | 6/2007 | Full et al. | .................... | 428/343 |
| 7,294,397 B2 * | 11/2007 | Jagota et al. | ................ | 428/357 |
| 7,335,271 B2 * | 2/2008 | Autumn | ...................... | 156/60 |
| 2002/0100581 A1 * | 8/2002 | Knowles et al. | ............. | 165/185 |
| 2003/0124312 A1 * | 7/2003 | Autumn | ...................... | 428/141 |
| 2003/0208888 A1 * | 11/2003 | Fearing et al. | ................ | 24/442 |
| 2004/0005454 A1 * | 1/2004 | Full et al. | .................... | 428/343 |
| 2004/0009353 A1 * | 1/2004 | Knowles et al. | ......... | 428/411.1 |
| 2004/0071870 A1 * | 4/2004 | Knowles et al. | ............. | 427/200 |
| 2004/0076822 A1 * | 4/2004 | Jagota et al. | ................ | 428/364 |
| 2005/0072509 A1 * | 4/2005 | Full et al. | ..................... | 156/57 |
| 2005/0148984 A1 * | 7/2005 | Lindsay et al. | ............. | 604/387 |
| 2005/0163997 A1 * | 7/2005 | Van Trump et al. | ......... | 428/375 |
| 2005/0181170 A1 * | 8/2005 | Fearing et al. | ................ | 428/85 |
| 2005/0181629 A1 * | 8/2005 | Jagota et al. | ................ | 438/780 |

(Continued)

FOREIGN PATENT DOCUMENTS

WO    WO 01/49776    7/2001

*Primary Examiner*—Cheryl Juska
(74) *Attorney, Agent, or Firm*—Irene Plotzker (57) ABSTRACT

This invention relates to a fibrillar microstructure and processes for the manufacture thereof. These processes involve micromachining and molding, and can prepare sub-micron dimensioned fibrillar microstructures of any shape from polymeric as well as other materials.

12 Claims, 6 Drawing Sheets

U.S. PATENT DOCUMENTS

| | | | |
|---|---|---|---|
| 2005/0271869 A1* | 12/2005 | Jackson | 428/297.4 |
| 2005/0271870 A1* | 12/2005 | Jackson | 428/297.7 |
| 2006/0005362 A1* | 1/2006 | Arzt et al. | 24/442 |
| 2006/0068668 A1* | 3/2006 | Kameoka et al. | 442/340 |
| 2006/0078725 A1* | 4/2006 | Fearing et al. | 428/323 |
| 2006/0097429 A1* | 5/2006 | Van Trump | 264/344 |
| 2006/0122596 A1* | 6/2006 | Dubrow | 606/60 |
| 2006/0165952 A1* | 7/2006 | Dubrow | 428/97 |
| 2006/0202355 A1* | 9/2006 | Majidi et al. | 257/783 |
| 2006/0213599 A1* | 9/2006 | Knowles et al. | 156/72 |
| 2006/0237126 A1* | 10/2006 | Guffrey et al. | 156/265 |
| 2008/0023439 A1* | 1/2008 | Jackson | 216/33 |
| 2008/0113147 A1* | 5/2008 | Jagota et al. | 428/97 |

* cited by examiner

Figure 6

FIBRILLAR MICROSTRUCTURE AND PROCESSES FOR THE PRODUCTION THEREOF

This application claims the benefit of U.S. Provisional Application No. 60/501,522, filed Sep. 8, 2003, and U.S. Provisional Application No. 60/501,524, filed Sep. 8, 2003, each of which is incorporated in its entirety as a part hereof for all purposes.

FIELD OF THE INVENTION

This invention relates to a fibrillar microstructure and processes for the manufacture thereof. These processes involve micromachining and molding, and can prepare sub-micron dimensioned fibrillar microstructures of any shape from polymeric as well as other materials.

BACKGROUND OF THE INVENTION

Many organisms have evolved a fibrillated interface for controlled contact and adhesion. As discussed in WO 01/49776, for example, the Gecko lizard appears to have evolved the ability to create dry, re-applicable adhesion to a variety of surfaces by relying only on weak van der Waals forces. Despite the low intrinsic energy of separating surfaces held together by van der Waals forces, these organisms are able to achieve remarkably strong adhesion. The microstructure employed by the Gecko, consisting of fibrils called setae and spatulae, plays a critical role in this ability.

Processes disclosed in WO 01/49776 describe replicating the natural structure of the gecko's foot by casting the structure, generally from a mold. This involves creating a template on a micro scale, placing the material from which the structure is to be fabricated into the mold, and then either extracting the structure, or dissolving the mold away.

A need remains, however, for processes that are more versatile than those known in the art by which a fibrillar microstructure may be prepared. The improved processes of this invention enable the production of new kinds of fibrillar microstructures.

SUMMARY OF THE INVENTION

One embodiment of this invention is a process for making a fibrillar microstructure by (a) applying a first layer of photoresist material to a substrate wherein the layer has a pre-selected thickness;

(b) removing material from the first layer at a plurality of locations to create at each location a channel through the first layer wherein each channel has a pre-selected cross-sectional shape and size, and wherein the substrate is exposed at the location of each channel;

(c) creating in the substrate at each location a corresponding channel having a pre-selected depth and having the same cross-sectional shape and size of the channel in the first layer at that location;

(d) removing the remainder of the first layer of photoresist material from the substrate;

(e) applying a second layer of photoresist material on the substrate and in the channels of the substrate wherein the second layer has a pre-selected thickness;

(f) removing material from the second layer at a plurality of locations to create at each location a channel through the second layer wherein each channel has a pre-selected cross sectional shape and size, and wherein a plurality of channels in the substrate are exposed at the location of each channel in the second layer;

(g) removing from each channel in the substrate exposed by a channel in the second layer the photoresist material of the second layer;

(h) applying a flowable microstructure material to the second layer of photoresist material to fill the exposed channels of the substrate and of the second photoresist layer and to create a layer of flowable material on the second photoresist layer;

(i) hardening the flowable microstructure material to form a fibrillar microstructure; and (j) separating the fibrillar microstructure from the channels of the second layer and the substrate.

Another embodiment of this invention is a process for making a fibrillar microstructure by (a) applying a first layer of photoresist material to a substrate wherein the layer has a pre-selected thickness;

(b) removing material from the first layer at a plurality of locations to create at each location a channel through the first-layer wherein each channel has a pre-selected cross-sectional shape and size, and wherein the substrate is exposed at the location of each channel;

(c) creating in the substrate at each location a corresponding channel having a pre-selected depth and having the same cross-sectional shape and size of the channel in the first layer at that location;

(d) applying a second layer of photoresist material on the first layer and in the channels of the first layer and in the channels of the substrate wherein the second layer has a pre-selected thickness;

(e) removing material from the second layer at a plurality of locations to create at each location a channel through the second layer wherein each channel has a pre-selected cross-sectional shape and size, and wherein a plurality of channels in the first layer are exposed at the location of each channel in the second layer;

(f) removing from each channel in the first layer exposed by a channel in the second layer, and removing from each corresponding channel in the substrate, the photoresist material of the second layer;

(g) applying a flowable microstructure material to the second layer of photoresist material to fill the exposed channels in the second layer, the first layer and the substrate and to create a layer of flowable material on the second photoresist layer;

(h) hardening the flowable microstructure material to form a fibrillar microstructure; and (i) separating the fibrillar microstructure from the channels of the first and second layers and the substrate.

A further embodiment of this invention is a process for making a fibrillar microstructure by (a) applying a layer of photoresist material to a surface of a substrate wherein the layer has a pre-selected thickness;

(b) removing material from the photoresist layer at a plurality of locations to create at each location a channel through the layer wherein each channel has a pre-selected cross-sectional shape and size, and wherein the substrate is exposed at the location of each channel;

(c) creating in the substrate at each location a corresponding channel having a pre-selected depth and having in a portion of the substrate channel proximal to the surface the same cross-sectional shape and size of the channel in the photoresist layer at that location, and having in a portion of the substrate channel distal from the surface a different cross-sectional shape and size than the channel in the photoresist layer at that location;

(d) filling the channels in the substrate with a flowable microstructure material;

(e) hardening the flowable microstructure material to form a fibrillar microstructure; and (f) separating the fibrillar microstructure from the channels of the substrate.

Yet another embodiment of this invention is a fibrillar microstructure that includes (a) a foundation, (b) a plurality of first-tier fibrils, each of which is attached at a first end to the foundation, and (c) a plurality of second-tier fibrils, each of which is attached to a second end of a first-tier fibril;

wherein each first-tier fibril has a cross-sectional shape that is selected from the group consisting of circular, elliptical and polygonal; and wherein each second-tier fibril has a cross-sectional shape that is selected from the group consisting of circular, elliptical or polygonal but that is different from the cross-sectional shape of the first-tier fibril to which it is attached.

DETAILED DESCRIPTION OF PREFERRED EMBODIMENTS OF THE INVENTION

The fabrication processes of this invention can generate a mat-like fibrillar microstructure from virtually any polymeric, oligomeric or ceramic material, or from any other material that has sufficient mechanical stability to undergo formation into a fibril. The fibrillar microstructure is referred to as fibrillar because it is constituted of fibrils, which may be considered to be very fine filaments, and a foundation in which each of the fibrils is an individual nano to micro-dimensioned protrusion that is secured to the foundation and extends or is projected therefrom. The foundation is generally planar in its dimensions, but is often prepared from material that gives it flexibility and thus the capability of being formed into a variety of shapes.

One-method for making the fibrillar microstructure of this invention is by molding a suitable material into the form of a substrate having fibrils attached thereto. The molding operation utilizes a master mold form prepared by photolithographic means. Using the master mold form, fibrils can be fabricated that have the shapes and sizes, and have the dimensions and other properties, as set forth herein. A variety of lithographic methods that provide for a cutting or etching process in accordance with a patterning system is suitable for use herein, including but not limited to contact photolithography, proximity photolithography, projection photolithography, interference photolithography, immersion projection photolithography, immersion interference photolithogrpahy, nanoimprint of thermal type, nanoimprint of optical type (step and flash), and soft lithography.

Lithography is a method for preparation of the master form used to mold the fibrils of an apparatus of this invention. Photolithography is a specific form of lithography where light is used as a degrading force. In a photolithographic method, a photoresist is exposed to electromagnetic radiation, such as ultraviolet light (UV), deep ultraviolet light (DUV), extreme ultraviolet light (EUV) or X-ray. This exposure introduces a latent image on the photoresist, for example, a pattern with difference in solubility. This results from chemical changes in the molecular structure of the resist. The latent image is subsequently developed into relief structures through etching. Electron beam irradiation, or ion-beam irradiation can be used instead of electromagnetic radiation to introduce an image on the photoresist.

The exposure of the photoresist is usually patterned either by interposing a mask between the source of radiation and the material of the photoresist, or by scanning a focused spot of the radiation source across the surface of the material. When masks are used, the lithographic process yields a replica (reduced in size if desired) of the pattern on the mask. A lithographic mask or photomask is master mask that defines the pattern of radiation incident on the photoresist. A photomask may include a flexible sheet element having areas, which are transparent to radiation incident on the photosensitive layer and complementary areas which are effectively opaque to that radiation; the opaque and transparent area defining the complementary image features to be transferred to the photosensitive layer. Typically the photomask is in a projection lithography stepper, where the projection lens is located between the photomask and the photoresist coated substrate. In the case of proximity or contact lithography, the photomask is proximate to (i.e. sufficiently close so as to be in the line of photons thereby effecting a pattern on the resist) or in contact with the resist layer of the cutting device.

Figure 1:
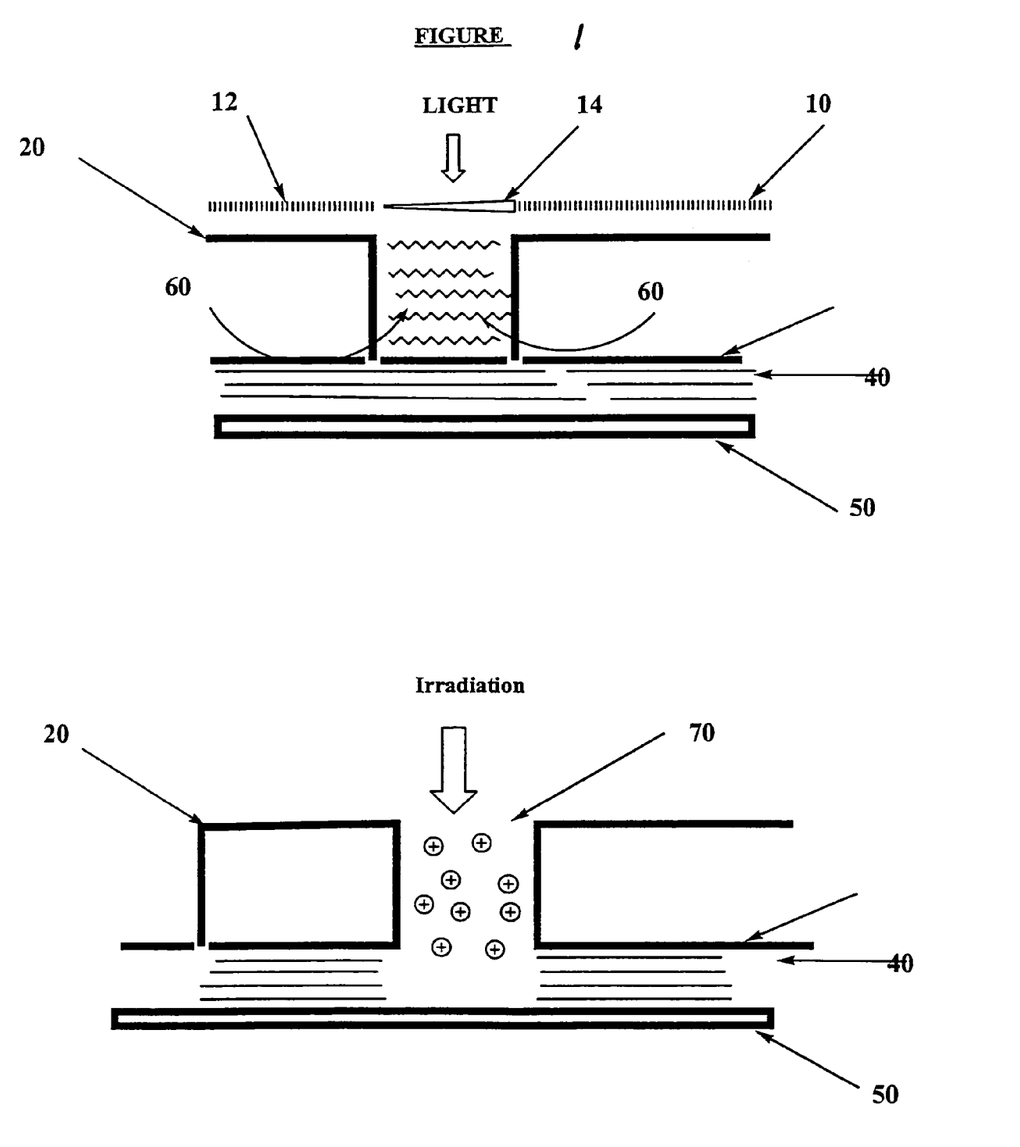
FIG. 1 is an illustration of the operation of a negative photoresist.

Negative or positive resist materials comprise two families of photoactive or radiation-sensitive material. Negative resists become less soluble after exposure to radiation, and thus the unexposed areas can be removed by treatment with an appropriate solvent or developer. Positive resists, on the other hand, increase in solubility upon exposure, enabling the exposed regions to be removed in the solvent or developers. The areas of resist that remain following the imaging and development processes are used to mask the underlying substrate for subsequent etching or other image-transfer steps. If, for example, the underlying substrate or base were $SiO_2$, immersion of the structure into an etchant such as buffered hydrofluoric acid would result in selective etching of the SiO2 in those areas that were bared during the development step. Resist material can be classified as positive or negative on the basis of their radiation response [Thompson et al., *Introduction to Microlithography*, American Professional Reference Book, pages 14-15 and 155-156, American Chemical Society, Washington, D.C., (1994)].

Where typical photoresist technology is used, either a negative or positive resist method may be employed for the cutting process. The negative resist method is illustrated in FIG. 1. As shown in FIG. 1, a photomask (10) is set proximate to a negative resist (20), which in turn is in contact with a mold layer (40). The photomask (10) is comprised of light transmitting (12) and light non-transmitting (14) regions.

The mold layer (40) is positioned on a solid substrate (50). The shape and/or spacing of the light non-transmitting regions of the photomask (14) determine the image created on the photoresist and, ultimately the design of the pattern. The layout of the mask is thus derived from the dimensions desired to be produced in the fibrils of the adhesive apparatus.

The method proceeds when the negative resist is selectively exposed to electromagnetic radiation via a light transmitting section of the photomask (12) and crosslinks the exposed section of the negative resist material (20). Optionally the noncrosslinked material may be removed by the application of a negative resist developer (60), revealing a portion of the mold layer (40).

After removal of the noncrosslinked negative resist, a cutting means (70), (typically irradiation with ions, plasma or electrons), is applied to the exposed mold layer (40) which results in the cutting of the mold layer (40) in the form of a pattern that will enable molding of an apparatus of this invention containing fibrils in the desired size and shape.

Figure 2:
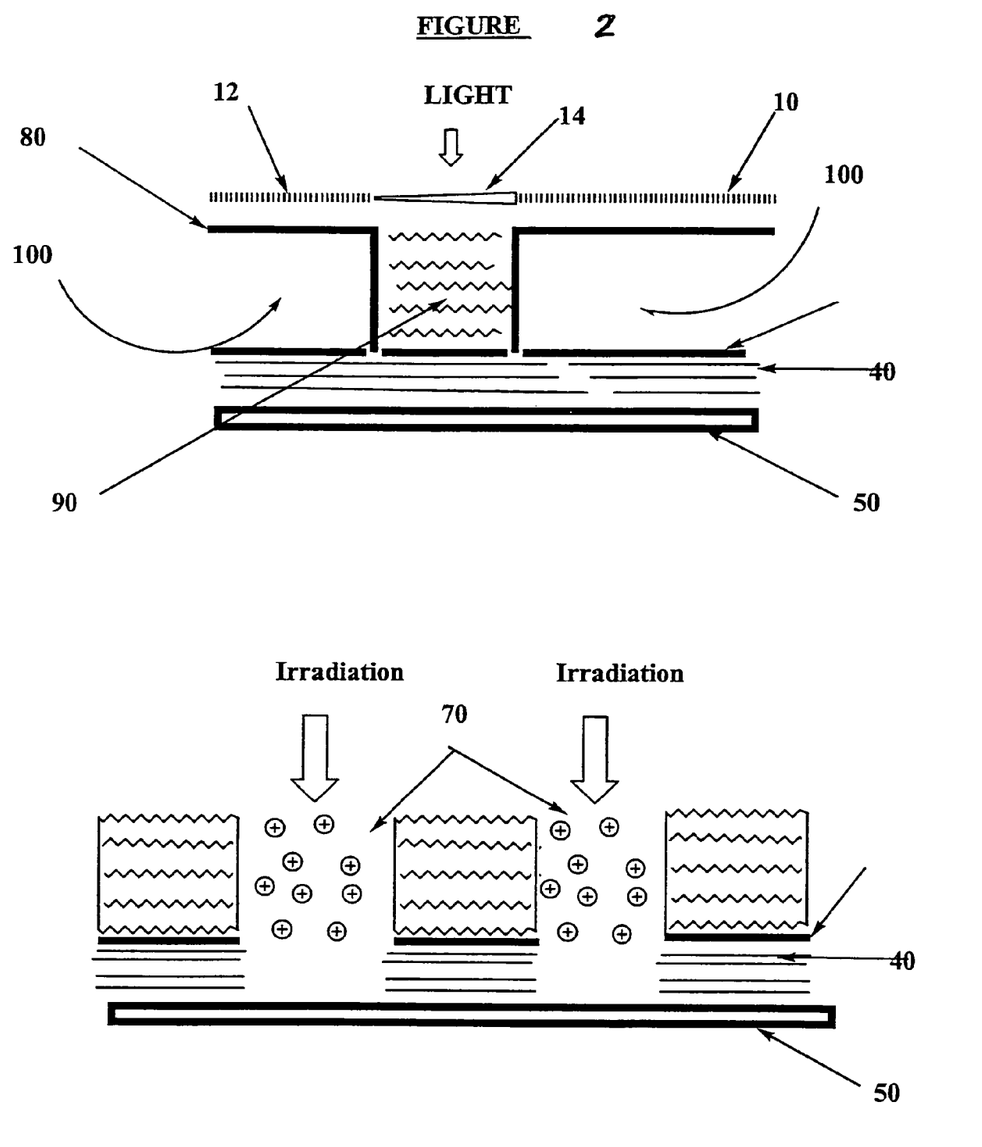
FIG. 2 is an illustration of the operation of a positive photoresist.

In another embodiment, this method makes use of a positive resist as opposed to a negative resist. Referring to FIG. 2, the method proceeds essentially as with the negative resist method except a positive resist layer (80) is included in the place of the negative resist. Exposure of the photomask (10) to light results in degradation of the positive photoresist material in the light transmitting region of the photomask (12), while in the non-light transmitting regions (90) the photoresist persists without degradation. A positive photoresist developer (100) is then applied which removes the degraded portion of the positive photoresist (80). When the cutting means (70), (typically irradiation with ions, plasma or electrons) is applied, the pattern layer is again cut in the form of a pattern that will enable molding of an apparatus of this invention containing fibrils in the desired size and shape.

The resist composition may be applied by spin coating or the like to form a resist film which is then pre-baked on a hot plate at 60° C. to 200° C. for 10 seconds to 10 minutes, and preferably at 80° C. to 150° C. for ½ to 5 minutes. In the contact, proximity or projection lithography approach a patterning mask having the desired pattern may then be placed over the resist film and the film exposed through the mask to an electron beam or to high-energy radiation having a wavelength below 300 nm such as deep-UV rays, excimer laser light, or x-rays in a dose of about 1 to 200 mJ/cm$^2$, and preferably about 10 to 100 mJ/cm$^2$, then post-exposure baked (PEB) on a hot plate at 60° C. to 150° C. for 10 seconds to 5 minutes, and preferably at 80° C. to 130° C. for ½ to 3 minutes. Finally, development may be carried out using a developer such as TMAH.

Typical photoresist materials include acrylates, phenol/formaldehyde condensates, polyalkylaldehyde, ortho-diazoketone and isoprene.

Subsequently, the latent pattern on the photoresist is etched out to remove those sections of the mold layer that are not protected by the photoresist. Following the etching process, the resist is removed for example, by stripping, hydrolysis, dissolution, or reaction. Developers useful in the present invention may include for example, aqueous alkali solution, such as 0.1 to 5%, and preferably 2 to 3%, tetramethylammonium hydroxide (TMAH). Developers may be applied by a conventional method such as dipping, puddling, or spraying for a period of 10 seconds to 3 minutes, and preferably 30 seconds to 2 minutes.

The exposed mold layer is irradiated with a source of ions, through the photomask with a specific pattern, and cutting of the mold layer takes place. In this fashion, a master mold is obtained from which an apparatus having fibrils of the size and shape as described herein can be produced.

Cutting is accomplished in a bath of etchant liquid, or by dry etching. Dry etching includes the utilization of ionized radiation including but not limited to photon irradiation utilizing ionized radiation such as ultraviolet rays, X-rays, electron irradiation, ion-beam irradiation, reactive ion etching, sputter etching, vapor phase etching, and neutral atoms machining. Specifically, deep-UV rays having a wavelength of 254 to 120 nm, an excimer laser, especially ArF excimer laser (193 nm), $F_2$ excimer laser (157 nm), $Kr_2$ excimer laser (146 nm), KrAr excimer laser (134 nm) or Ar excimer laser (121 nm), x-rays, or an electron beam are particularly useful.

Etching by plasma, which is an assembly of ions, electrons, neutral atoms and molecules in which particle motion is governed primarily by electromagnetic forces, or a partially ionized gas containing an approximately equal number of positive and negative charges, as well as some other number of non-ionized gas species, also has certain utilities in the processes of this invention. Deep reactive ion etching ("DRIE") involves a series of alternating etch and passivation cycles, each lasting only a few seconds, as more fully described in U.S. Pat. No. 5,501,893. Each passivation step coats the surface being etched with a polymer layer, preventing lateral etching by radicals. A fluorocarbon polymer is often used for passivation, and the rate of deposition of the polymer is controlled by the ratio of fluorine-to-carbon in the source gas. After a passivation step in which all exposed surfaces of the channel being cut in the substrate are coated with polymer, ion bombardment during the next etch step of the process removes the polymer from the bottom of the channel normal to the direction of ion motion, and an isotropically etched cavity is then created. This process results in microscopic "scallops" on the channel sidewalls being etched. The degree of sidewall scalloping may be controlled by varying the length of each etch/passivation cycle. An etch stop, a layer of oxide in the substrate, may be used if desired to help prevent etching from exceeding a pre-selected depth for the channel. The plasma in an ion etcher is typically generated by radio frequency energy, and this if desired may be enhanced by use of an inductively coupled plasma system in which the RF-energy is coupled into a low pressure gas by an inductive coil mounted on the outside of a quartz window. ICP etchers produce relatively low ion energies, and biasing of the substrate being etched may thus be used to tailor ion bombardment energies tuning the degree of anisotropy of the resulting etch.

In one embodiment of this invention, a process can be performed to make a fibrillar microstructure by etching a mold from a substrate using photolithographic techniques as described above. A first layer of photoresist material is applied to a substrate such as a silicon wafer. This first layer will have a pre-selected thickness. Photoresist material is removed from the first layer at a plurality of locations to create at each location a channel through the first layer wherein each channel has a pre-selected cross-sectional shape and size, and wherein the substrate is exposed at the location of each channel. Photoresist material is removed from the first layer, using techniques as described above, by irradiating the first layer through a mask, and then dissolving away the photoresist material at the selected locations. The substrate is referred to as exposed in the sense that the areas from which photoresist material of the first layer has been removed may then be subjected to etching.

The cross-sectional shape of the channels created in the first layer is determined by the design of the mask, and may be selected from shapes such as circular, elliptical or polygonal such as triangular, diamond, rectangular, hexagonal or octagonal; or the cross-sectional shape may be irregular. The cross-sectional shape of each channel may be selected independently from that of each of the other channels. The cross-sectional size of each channel is the length of the longest dimension of the cross-sectional shape of each channel, such as the diameter of a circle, and each may independently of each other be in the range of from about 0.1 micron to about 1 micron.

After the material of this first photoresist layer has been removed at the selected locations, an etching means is employed to create in the substrate at each location a corresponding channel having a pre-selected depth and having the same cross-sectional shape and size of the channel in the first layer at that location. The remainder of the photoresist material of the first layer is typically then removed from the substrate. In an optional embodiment, however, the remaining photoresist material of the first layer is not removed.

A second layer of photoresist material is then applied on the substrate and in the channels of the substrate (or on the first layer and in the channels of the first layer and in the channels of the substrate if the first layer remains) wherein the second layer has a pre-selected thickness. A preferred material to use for the second layer of photoresist material is SU-8, which is an epoxy-based photoresist that is polymerizable by cationic photopolymerization and is further described in U.S. Pat. No. 4,882,245.

Photoresist material is removed from this second layer at a plurality of locations to create at each location a channel through the second layer wherein each channel has a pre-selected cross-sectional shape and size. A plurality of channels in the substrate (or in the first layer if it remains) are thereby exposed at the location of each channel in the second layer. Photoresist material is removed from the second layer using techniques as described above, by irradiating the second layer through a mask, and then dissolving away the photoresist material at the selected locations. Channels in the substrate (or in the first layer if it remains) are referred to as exposed in the sense that, after all necessary photoresist material of the second layer has been removed, those channels may then be filled with a fibrillar microstructure material.

The cross-sectional shape of the channels created in this second layer is determined by the design of the mask, and may be selected from shapes such as described above. The cross-sectional shape of each second-layer channel may be selected independently from that of each other channel. The cross-sectional shape of each second-layer channel may be the same as or different from any one or more of the channels in the substrate (and also in the first layer if it remains) that are exposed by the creation of each second-layer channel. The cross-sectional size of each channel is the length of the longest dimension of the cross-sectional shape of each channel, such as the diameter of a circle, and each may independently of each other be in the range of from about 2 microns to about 10 microns.

Removal of photoresist material from the second layer at the locations of the second-layer channels also results in removal of the same photoresist material that was deposited in each channel in the substrate corresponding to a first-layer channel. If the first photoresist layer remains, removal of the photoresist material of the second layer also result in removal of that same photoresist material from the first-layer channels.

Figure 3:
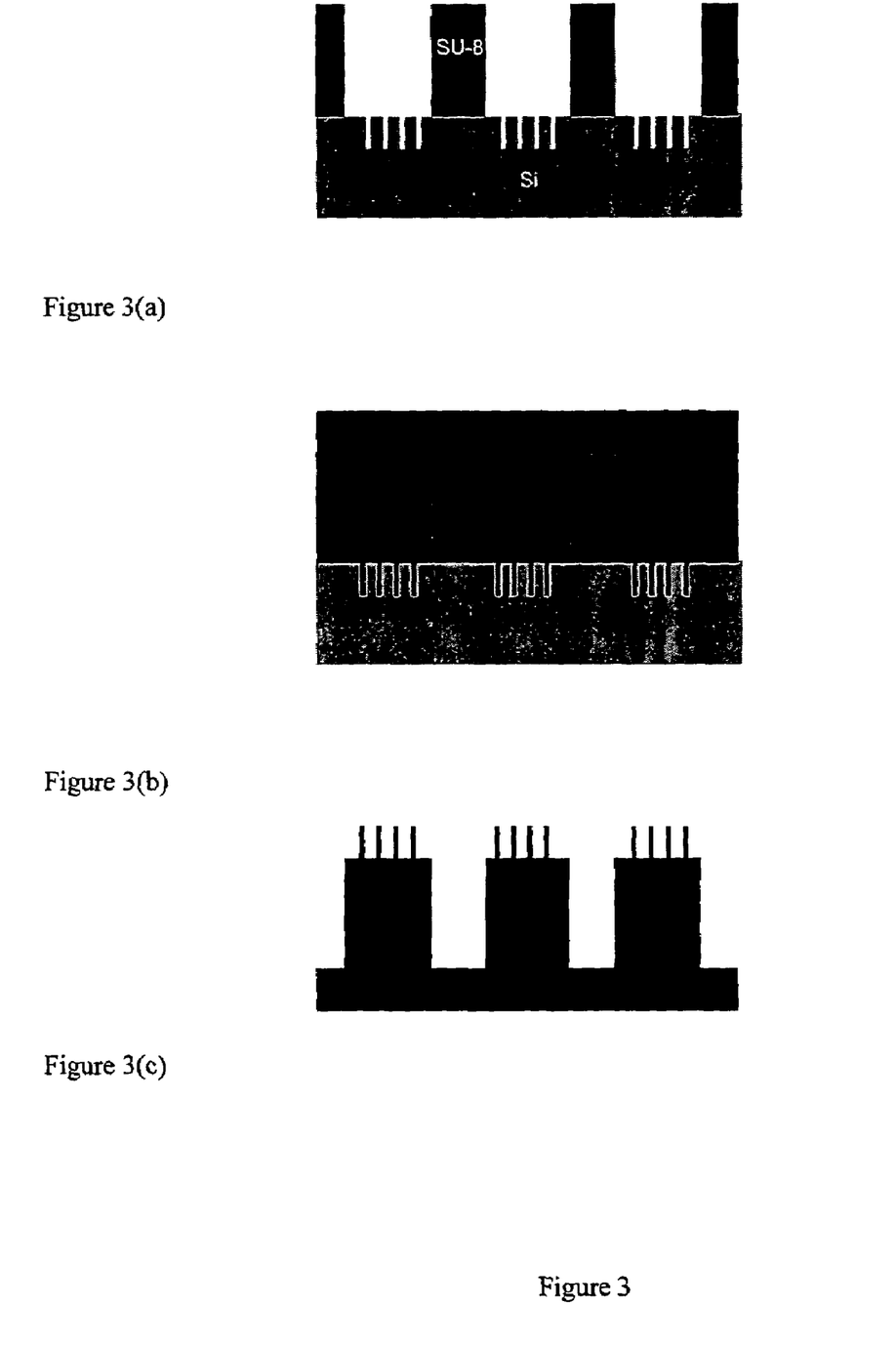
FIG. 3 is an illustration of a mold for a fibrillar microstructure, a fibrillar microstructure being molded, and a fibrillar microsturcutre separated from a mold.

The longitudinal axis of each channel will typically be, if not perpendicular, essentially perpendicular to (i.e. forming an angle of less than 15° off of normal with) a plane that is, in each instance, represented by the substrate and the first and second photoresist layers. Removal of photoresist material from all channels thus creates a multi-layer mold composed of the substrate and the second layer, and optionally the first layer, in which a plurality of channels in the substrate (and also in the first layer if it remains) is exposed by and accessible through each single channel in the second layer. Such a mold is shown in FIG. 3(a).

The exposed channels in the second layer and the substrate (and those in the first layer if it remains) are then filled with a flowable microstructure material, and a layer of microstructure material is also created on top of the second photoresist-layer. This arrangement is shown in FIG. 3(b). The flowable material can, for example, be placed in and on the mold by melt coating or solution coating. The microstructure material is then hardened (for example, by cooling or devolatilization of solvent), and in its hardened form is then separated from the channels in the second layer and the substrate (and from those in the first layer if it remains).

Figure 4:
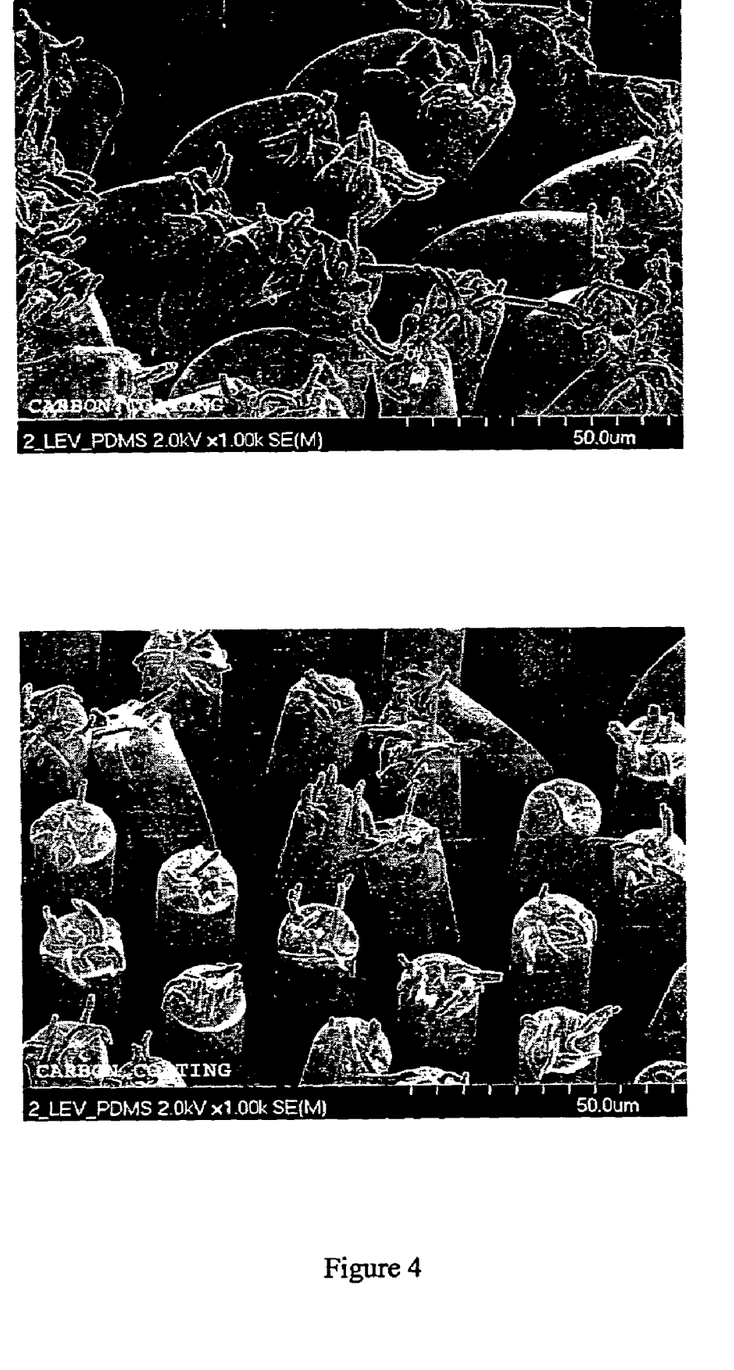
FIG. 4 is micrograph of a fibrillar microstructure having two tiers of fibrils.

The microstructure material in its hardened form as separated from the mold created from the multiple layers of substrate and photoresist material is a fibrillar microstructure. Its foundation is created by the layer of flowable microstructure material that was formed on top of the second photoresist material before hardening. A plurality of first-tier fibrils, each of which is attached at a first end to the foundation is created by the flowable material that was placed before hardening in the channels of the second photoresist layer. A plurality of second tier fibrils, each of which is attached to a second end of a first-tier fibril, is created by the flowable material that was placed before hardening in the channels of the substrate (and the channels in the first photoresist layer if it remains). A graphical representation of a fibrillar microstructure thus formed is shown in FIG. 3(c). A photomicrograph of the first-tier fibrils, and the second-tier fibrils located thereon, in a fibrillar microstructure actually made by the process described above is shown in FIG. 4.

In an alternative embodiment of the process described above, a first layer of photoresist material is applied to the substrate, and material is removed from this first layer at a plurality of locations to create at each location a channel through the first layer wherein each channel has a pre-selected cross-sectional shape and size, and wherein the substrate is exposed at the location of each channel. Photoresist material is removed from the first layer, using techniques as described above, by irradiating this first layer through a mask, and then dissolving away the photoresist material at the selected locations. The cross-sectional shape and size of the channels created in the first layer of photoresist material is determined by the design of the mask.

After the photoresist material of this first layer has been removed at the selected locations, an etching means is employed to create in the substrate at each location a corresponding channel having a pre-selected depth and having the same cross-sectional shape and size of the channel in the first layer at that location. The remainder of the photoresist material of the first layer is typically then removed from the substrate.

A second layer of photoresist material is then applied on the substrate and in the channels of the substrate. Photoresist material is removed from this second layer at a plurality of locations to create at each location a channel through the second layer wherein each channel has a pre-selected cross-sectional shape and size. Photoresist material is removed from this second layer, using techniques as described above, by irradiating this second layer through a mask, and then dissolving away the photoresist material at the selected locations. The substrate is exposed at the location of each of the channels in the second layer, but a mask is used that has a design such that each channel in the second layer is smaller in cross-sectional size than any of the channels that already exist in the substrate, the location of each channel in the second photoresist layer falls within the location of a channel that already exists in the substrate, and no channel in the second photoresist layer has a location that falls outside of the location of a channel that already exists in the substrate.

The substrate is then etched through the channels in the second photoresist layer, which creates a subset of smaller channels within each channel that already exists in the substrate, with the depth of the channels in the subset being controlled by the strength and duration of the etch. The material of the second photoresist layer is then removed, and the substrate is used as mold in the manner described above.

In a fibrillar microstructure prepared by the processes described above, a first-tier fibril has a length $L^1$ in the range of about 10 to about 150 microns (or alternatively in the range of about 15 to about 100 microns), and a second-tier fibril has a length $L^2$ in the range of about 0.5 to about 15 microns (or alternatively in the range of about 0.75 to about 10 microns). The length of the first-tier fibrils is determined by the pre-selected thickness of the second photoresist layer, and the length of the second-tier fibrils is determined by the pre-selected depth to which the channels are etched in the substrate (together with the pre-selected thickness of the first photoresist layer if it remains). The first-tier fibrils have a characteristic width $a^1$ in the range of about 2 to about 10 microns (or alternatively in the range of about 3 to about 5 microns), and the second-tier fibrils have a characteristic width $a^2$ in the range of about 0.1 to about 1 microns (or alternatively in the range of about 0.3 to about 0.5 microns). The characteristic width of a fibril is the length of the longest dimension of the cross-sectional shape of the fibril, such as the diameter of a circle. The characteristic width of the first-tier fibrils is determined by the cross-sectional size and shape of the channels in the second photoresist layer, and the characteristic width of the second-tier fibrils is determined by the cross-sectional size and shape of the channels in the substrate (and those in the first photoresist layer if it remains).

Figure 5:
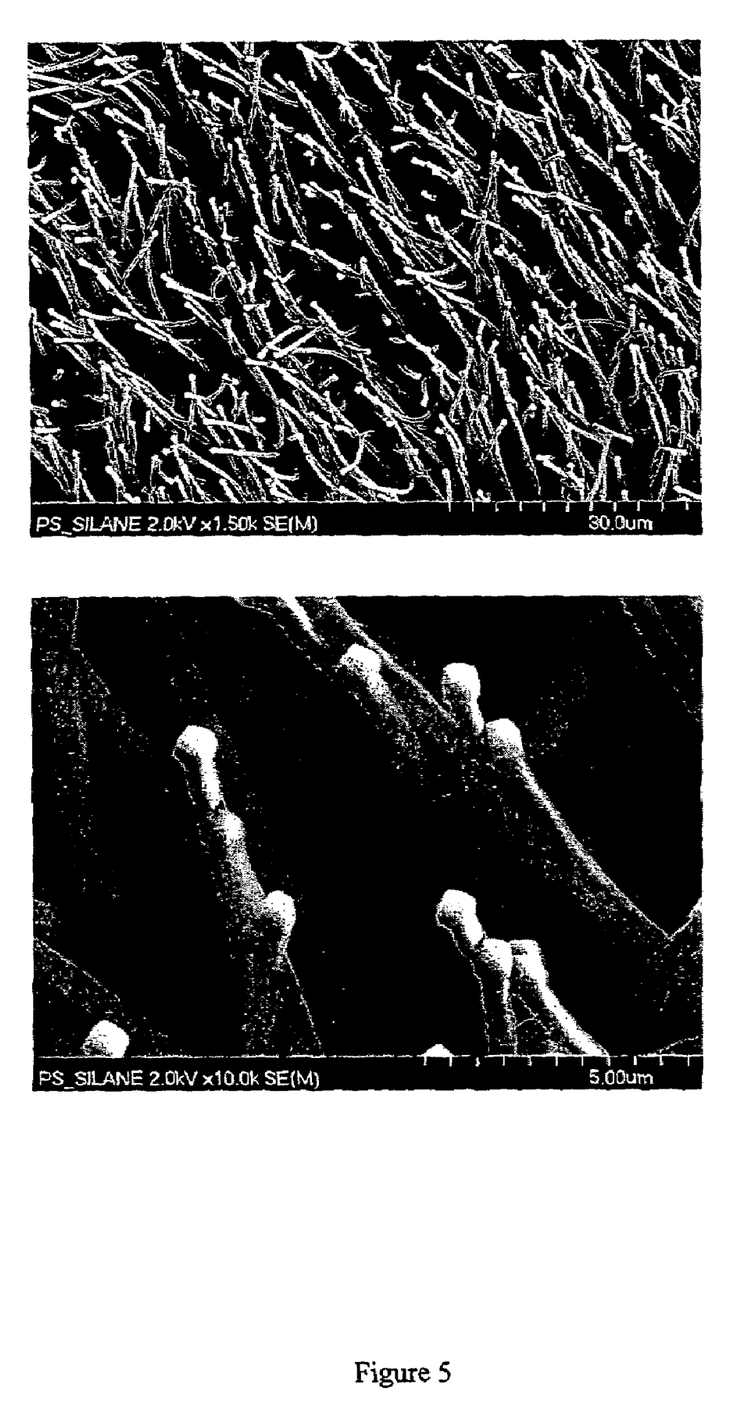
FIG. 5 is micrograph of a fibrillar microstructure having a single tier of fibrils.

In an alternative embodiment of this invention, a fibrillar microstructure may be made in which each fibril is larger at the free end than at the end at which is secured to a foundation. Fibrils characterized by such feature are shown in FIG. 5. In this process, a layer of photoresist material is applied to a surface of a substrate wherein the layer has a pre-selected thickness. Material is then removed from the photoresist layer at a plurality of locations to create at each location a channel through the layer wherein each channel has a pre-selected cross-sectional shape and size, and wherein the substrate is exposed at the location of each channel. At each location, a corresponding channel having a pre-selected depth is then created in the substrate.

Each channel in the substrate also has, in a portion of that channel proximal to the surface the same cross-sectional shape and size of the channel in the photoresist layer at that location. But each channel in the substrate also has in a portion of that channel distal from the surface a different cross-sectional shape and size than the channel in the photoresist layer at that location. The different size in the portion of the substrate channels distal from the surface is usually a larger size. When that is the case, the difference in size may be created, for example, by reducing or eliminating passivation in a DRIE system at the bottom of the channel, i.e. at a location close to the pre-selected depth, to engage intentionally in isotropic etching and create an enlarged scallop or notch in the substrate. The presence of an etch-stop, e.g. a layer of oxide, in the substrate may assist in placing the notch at the desired depth. A smaller size in the distal portion, such as a tapered or cone shape, could be obtained by increasing passivation at the bottom of the channel.

The channels in the substrate are then filled with a flowable microstructure material, and the flowable microstructure material is hardened to form a fibrillar microstructure as described above. The fibrillar microstructure is then separated from the channels of the substrate. In a preferred embodiment, the photoresist layer is removed before the channels of the substrate are filled with the fibrillar microstructure material, but the photoresist layer may remain if desired.

The length of the portion of each channel that is proximal to the surface of the substrate, and that has the same cross-sectional shape and size of the corresponding channel in the photoresist layer at that location, may be more than about 90% of the length of the channel, and may in other embodiments be more than about 95%, about 98% or about 99% of the length of the channel. The length of the portion of each channel that is distal from the surface of the substrate, and that has a different cross-sectional shape and size than the corresponding channel in the photoresist layer at that location, may be less than about 10% of the length of the channel, and may in other embodiments be less than about 5%, about 2% or about 1% of the length of the channel. As a result, the length of the portion of each fibril that is proximal to the foundation of the fibrillar microstructure, and that has the same cross-sectional shape and size of the corresponding channel in the photoresist layer at that location, may be more than about 90% of the length of the fibril, and may in other embodiments be more than about 95%, about 98% or about 99% of the length of the fibril. The length of the portion of each fibril that is distal from the foundation, and that has a different cross-sectional shape and size than the corresponding channel in the photoresist layer at that location, may be less than about 10% of the length of the fibril, and may in other embodiments be less than about 5%, about 2% or about 1% of the length of the fibril.

As noted above, the cross-sectional shape of the portion of each channel that is proximal to the surface of the substrate, and correspondingly the cross-sectional shape of the portion of each fibril that is proximal to the foundation of the fibrillar microstructure, may be independently selected from among a variety of shapes such as those described above.

In a fibrillar microstructure prepared by the process described above, a fibril, including both the portions that are proximal to and distal from the foundation, may have a length L in the range of about 10 to about 150 microns (or alternatively in the range of about 15 to about 100 microns). The length of the fibrils is determined by the pre-selected depth to which the channels are etched in the substrate (together with the pre-selected thickness of the photoresist layer if it remains). The portion of each fibril that is proximal to the foundation may have a characteristic width a (as defined above) in the range of about 2 to about 10 microns (or alternatively in the range of about 3 to about 5 microns). The characteristic width of the portion of a fibril that is proximal to the foundation is determined by the cross-sectional size and shape of the portion of the channels that is proximal to the surface of the substrate (and the channels in the photoresist layer if it remains).

As noted above, the fibrils in a fibrillar microstructure of this invention may have a variety of cross-sectional shapes. As a result, a further embodiment of this invention is a fibrillar microstructure that has (a) a foundation, (b) a plurality of first-tier fibrils, each of which is attached at a first end to the foundation, and (c) a plurality of second tier fibrils, each of which is attached to a second end of a first-tier fibril; wherein each first-tier fibril has a cross-sectional shape that is selected from the group consisting of circular, elliptical and polygonal; and wherein each second-tier fibril has a cross-sectional shape that is selected from the group consisting of circular, elliptical or polygonal but that is different from the cross-sectional shape of the first-tier fibril to which it is attached. For example, a first-tier fibril may have a circular cross-sectional shape, and a second-tier fibril may have a triangular or diamond cross-sectional shape.

In particular embodiments, each first-tier fibril may have the same or a different cross-sectional shape, and each second-tier fibril may have the same or a different cross-sectional shape than the first-tier fibril to which it is attached. A polygonal shape may be selected from the group consisting of triangular, diamond, rectangular, hexagonal and octagonal. Variations in shape among the first-tier fibrils as a group, and variations in shape between a first-tier fibril and the second-tier fibrils attached thereto is useful as an aid in reducing clumping among the fibrils that are secured to a foundation to form a fibrillar microstructure.

Figure 6:
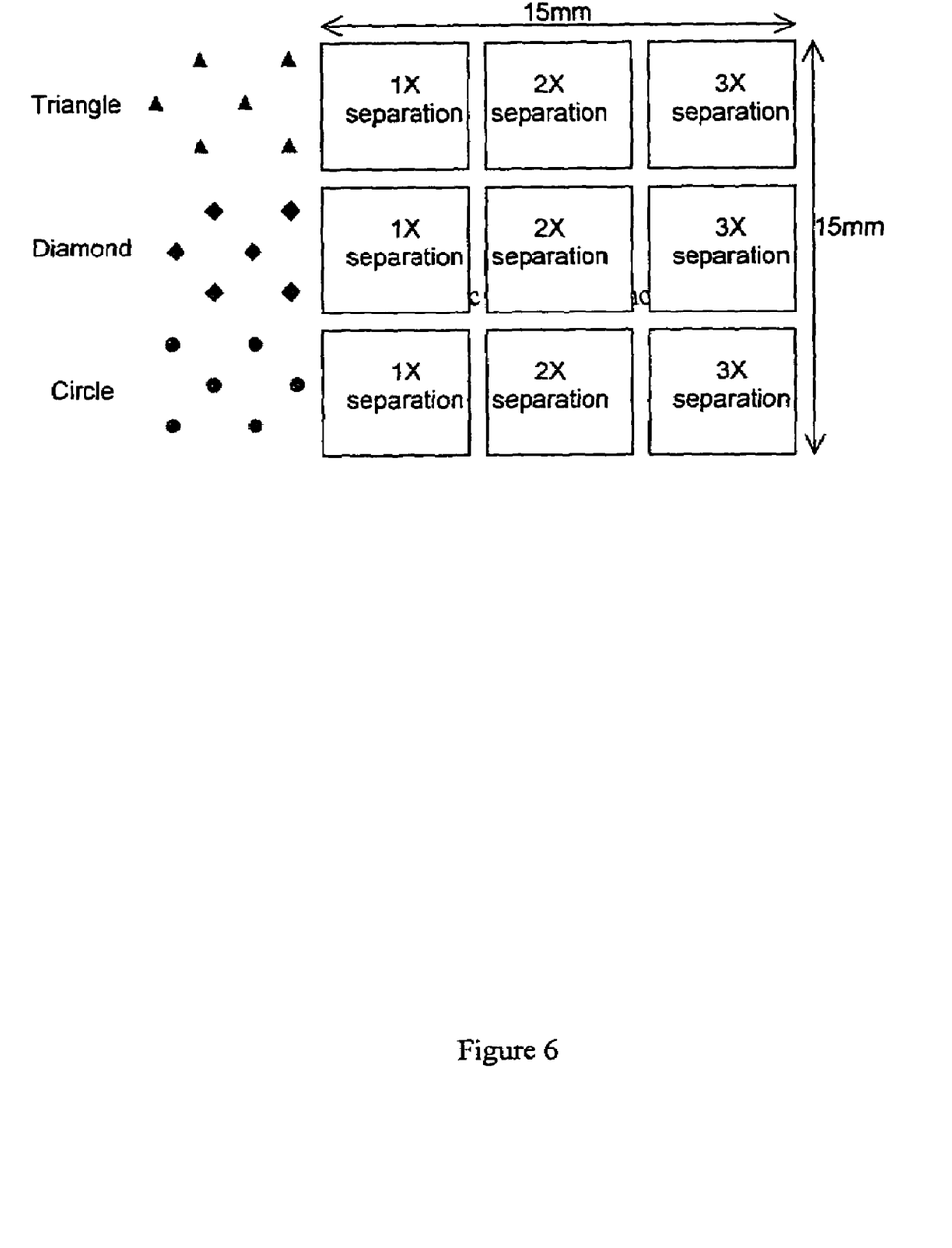
FIG. 6 is an illustration of an exemplary spacing and shape of openings or transparent spots in a photomask.

FIG. 6 shows a schematic of a 15 mm×15 mm fraction of the pattern on one of the many possible photomasks that may be used for the process of making a fibrillar microstructure according to this invention. UV light-transparent spots on the mask can be made of any desired shape, for example, triangle, diamond or circle. The shape of the openings or transparent spots in the mask determines the shape of the fibrils in the fibrillar microstructure produced therefrom, as described above. The separations of "1X", "2X" and "3X" correspond to the distance between two adjacent spots as measured in terms of the cross-sectional size of the spot, which is the length of the longest dimension of the cross-sectional shape of each channel, such as the diameter of a circle. For example, "1X" corresponds to a distance equivalent to 1 unit of size between two spots, "2X" corresponds to a distance equivalent to 2 units of size between two spots, and "3X" corresponds to a distance equivalent to 3 units of size between two spots. Shape and spacings patterns such as these can be repeated on the photomask as desired, and will cause channels to be created in the photoresist layer, and etched in the substrate, with the same pattern of shape and placement, and thus cause the formation of fibrils in the microstructure with the same pattern of shape and placement.

The spacing of the openings or transparent spots on the mask as described above controls the areal density of the fibrils (or the first-tier fibrils when a second tier exists) on the foundation, and the areal density of the second-tier fibrils on each first-tier fibril. Areal density is defined as the percentage of the area of a surface, either the foundation or the top of a first-tier fibril, occupied by the point of junction between fibril and foundation of the fibrils that are secured hereto. The areal density of fibrils on the foundation, or the areal density on the foundation of the first-tier fibrils when two tiers exist, may be in the range of about 3 to about 30 percent (or alternatively in the range of about 5 to about 10 percent). When they exist, the areal density of second tier fibrils on a first-tier fibril may be in the range of about 3 to about 15 percent (or alternatively in the range of about 5 to about 10 percent).

As noted above, the longitudinal axis of each channel will typically be, if not perpendicular, essentially perpendicular to (i.e. forming an angle of less than 15° off of normal with) a plane that is, in each instance, represented by the substrate and the first and second photoresist layers. As a consequence, in a further alternative, one or more of fibrils will have a neutral axis, passing through the centroid of the cross-sectional area of the fibril, that has an orientation with the plane of the foundation, at the point of intersection of the axis with the plane of the foundation, in the range of greater than 75° to about 90°. It is more preferred that such orientation of the neutral axis is in the range of about 80° to about 90°, and it is most preferred that it be in the range of about 85° to about 90°. Each second-tier fibril, when it exists, will desirably have the same orientation of the neutral axis thereof with the plane represented by the top of the first-tier fibril to which it is secured. Methods for determination of the orientation of a neutral axis are known in the art from sources such as *An Introduction to the Mechanics of Solids*, R. R. Archer et al, McGraw-Hill (1978), which is incorporated for such purpose as a part hereof.

Any melt processable thermoplastic material can be used to form the microstructure. Also, thermosetting materials can be used by in-situ polymerization of the monomer on the silicon-based mold. In this invention, the polymers from which the dispersed domains and/or the matrix may be made include polymers and copolymers, and blends of two or more of either or both that are amenable to extrusion and spinning. Exemplary polymers and/or copolymers include polyacetal, polyacetylene, polyacrylamide, polyacrylate, polyacrylic acid, polyacrylonitrile, polyamide, polyaminotriazole, polyaramid, polyarylate, polybenzimidazole, polybutadiene, polybutylene, polycarbonate, polychloroprene, polyesters, polyethers, polyethylenes (including halogenated polyethylenes), polyethylene imine, polyethylene oxide, polyimide, polyisoprene, polymethacrylate, polyoxadiazole, polyphenylene oxide, polyphenylene sulfide, polyphenylene triazole, polypropylene, polypropylene oxide, polysiloxanes (including polydimethyl siloxane), polystyrene, polysulfone, polyurethane, poly(vinyl acetal), poly(vinyl acetate), poly(vinyl alcohol), poly(vinyl butyral), poly(vinyl carbazole), poly(vinyl chloride), poly(vinyl ether), poly(vinyl fluoride), acrylonitrile/butadiene/styrene copolymer, acrylate copolymers (including ethylene/vinyl acetate/glycidyl methacrylate copolymer), styrene/acrylonitrile copolymer.

The polymers and/or copolymers from which a fibrillar microstructure is made may be selected from a subgroup of the foregoing formed by omitting any one or more members from the whole group as set forth in the list above. As a result, the polymer and/or copolymer may in such instance not only be one or more members selected from any subgroup of any size that may be formed from the whole group as set forth in the list above, but may also be selected in the absence of the members that have been omitted from the whole group to form the subgroup. The subgroup formed by omitting various members from the whole group in the list above may, moreover, be an individual member of the whole group such that the polymer or copolymer is selected in the absence of all other members of the whole group except the selected individual member. The subgroup formed by omitting various members from the whole group in the list above may, moreover, contain any number of the members of the whole group such that those members of the whole group that are excluded to form the subgroup are absent from the subgroup.

Examples of polymers particularly suitable for use to make a fibrillar microstructure include polyamide, poly(ether/amide), polyester, poly(ether/ester), polypropylene, polyacrylate, polystyrene, polyethylene, polypropylene, polydimethyl siloxane and polyvinylidine chloride. Other non-polymeric materials such as ceramics can also be used to generate the microstructures.

In an alternative embodiment, a solution of a polymer can be applied to the mold cut from the substrate as the material from which the microstructure is formed. Upon removal of solvent, a microstructure can be generated having porosity in the structure. A partially polymerized oligomeric species can also be used as the microstructure material, with subsequent polymerization occurring in the mold. Polymerizing an oligomeric that is admixed in its own monomer can help control the viscosity of the material that is transformed into the fibrillar microstructure. Selection of a polymer, copolymer or blend thereof according to the molecular weight distribution thereof can be utilized to control the production of fibrils with varying degrees of tensile strength and toughness.

The fibrillar microstructures made by the processes of this invention may take the form or appearance of a piled, plush or raised fabric similar to a velveteen, flannel or corduroy. These fibrillar microstructures are useful to make fabrics or filters, to make objects that have adhesive surfaces, and to make coverings for solid objects such a wall paper. The objects that have adhesive surfaces may be fabricated in the form of any type of sealing or fastening device such as a fastener for apparel, for luggage, or for a shoe.

Where an apparatus or method of this invention is stated or described as comprising, including, containing, having, being composed of or being constituted of or by certain components or steps, it is to be understood, unless the statement or description explicitly provides to the contrary, that one or more components or steps other than those explicitly stated or described may be present in the apparatus or method. In an alternative embodiment, however, the apparatus or method of this invention may be stated or described as consisting essentially of certain components or steps, in which embodiment components or steps that would materially alter the principle of operation or the distinguishing characteristics of the apparatus or method would not be present therein. In a further alternative embodiment, the apparatus or method of this invention may be stated or described as consisting of certain components or steps, in which embodiment components or steps other than those as stated would not be present therein.

Where the indefinite article "a" or "an" is used with respect to a statement or description of the presence of a component in an apparatus, or a step in a method, of this invention, it is to be understood, unless the statement or description explicitly provides to the contrary, that the use of such indefinite article does not limit the presence of the component in the apparatus, or of the step in the method, to one in number.

What is claimed is:

1. A fibrillar microstructure which is prepared from a flowable microstructure material, said fibrillar microstructure comprising (a) a foundation, (b) a plurality of first-tier fibrils, each of which is attached at a first end to the foundation, and (c) a plurality of second-tier fibrils, each of which is attached to a second end of a first-tier fibril;
   wherein each first-tier fibril has a cross-sectional shape that is selected from the group consisting of elliptical and polygonal; and
   wherein each second-tier fibril has a cross-sectional shape that is selected from the group consisting of elliptical or polygonal but that is different from the cross-sectional shape of the first-tier fibril to which it is attached.

2. A fibrillar microstructure according to claim 1 wherein each first-tier fibril has the same cross-sectional shape.

3. A fibrillar microstructure according to claim 1 wherein all first-tier fibrils do not have the same cross-sectional shape.

4. A fibrillar microstructure according to claim 1 wherein the polygonal shape is selected from the group consisting of triangular, diamond, rectangular, hexagonal and octagonal.

5. A fibrillar microstructure according to claim 1 wherein a first-tier fibril has a length in the range of about 10 to about 150 microns.

6. A fibrillar microstructure according to claim 1 wherein a first-tier fibril has a characteristic width in the range of about 2 to about 10 microns.

7. A fibrillar microstructure according to claim 1 wherein a second-tier fibril has a length in the range of about 0.5 to about 15 microns.

8. A fibrillar microstructure according to claim 1 wherein a second-tier fibril has a characteristic width in the range of about 0.1 to about 1 microns.

9. A fibrillar microstructure according to claim 1 wherein the first-tier fibrils have an areal density in the range of about 3 to about 30 percent.

10. A fibrillar microstructure according to claim 1 wherein the flowable microstructure material is selected from the group consisting of polyamide, poly(ether/amide), polyester, poly(ether/ester), polypropylene, polyacrylate, polystyrene, polyethylene, polypropylene, polydimethyl siloxane and polyvinylidine chloride.

11. A fibrillar microstructure according to claim 1 wherein each second-tier fibril has the same cross-sectional shape.

12. A fibrillar microstructure according to claim 1 wherein all second-tier fibrils do not have the same cross-sectional shape.

* * * * *